United States Patent
Hsieh et al.

(10) Patent No.: US 8,614,926 B2
(45) Date of Patent: Dec. 24, 2013

(54) MEMORY APPARATUS AND ASSOCIATED METHOD

(75) Inventors: Wen Pin Hsieh, Hsinchu Hsien (TW); Meng Hsun Hsieh, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 394 days.

(21) Appl. No.: 12/981,935

(22) Filed: Dec. 30, 2010

(65) Prior Publication Data

US 2011/0292741 A1 Dec. 1, 2011

(30) Foreign Application Priority Data

May 28, 2010 (TW) .............................. 99117301 A

(51) Int. Cl.
*G11C 7/00* (2006.01)

(52) U.S. Cl.
USPC ...................... 365/200; 365/189.08; 365/201

(58) Field of Classification Search
USPC .......... 365/200, 201, 189.05, 189.07, 189.08, 365/194
See application file for complete search history.

(56) References Cited

U.S. PATENT DOCUMENTS

| | | | |
|---|---|---|---|
| 5,134,583 A * | 7/1992 | Matsuo et al. | 365/200 |
| 5,485,425 A | 1/1996 | Iwai et al. | |
| 6,259,636 B1 | 7/2001 | Fukuda et al. | |
| 6,816,420 B1 * | 11/2004 | Liu et al. | 365/200 |
| 7,224,605 B1 | 5/2007 | Moogat et al. | |
| 2002/0085419 A1* | 7/2002 | Kwon et al. | 365/185.17 |
| 2008/0144379 A1* | 6/2008 | Bartoli et al. | 365/185.09 |

OTHER PUBLICATIONS

State Intellectual Property Office of the People's Republic of China, "Office Action", May 10, 2013, China.

* cited by examiner

*Primary Examiner* — Alexander Sofocleous
*Assistant Examiner* — Hien Nguyen
(74) *Attorney, Agent, or Firm* — WPAT, PC; Justin King

(57) ABSTRACT

A memory apparatus includes a plurality of first bit columns for constructing a common memory space and at least one reserve second bit column. A column address of a damaged first bit column is recorded as a predetermined column address. When a byte column is accessed, data recorded in the first bit columns and the second bit columns are respectively latched in a first latching device and a second latching device. In the event that the latched access data is accessed, data is outputted by comparing the predetermined column address of each first bit column and an access column address, and when the access column address matches with the predetermined column address, data is outputted via the second latching device; otherwise, the data is outputted via the first latching device.

7 Claims, 4 Drawing Sheets

MEMORY APPARATUS AND ASSOCIATED METHOD

CROSS REFERENCE TO RELATED PATENT APPLICATION

This patent application is based on Taiwan, R.O.C. patent application No. 099117301 filed on May 28, 2010.

FIELD OF THE INVENTION

The present invention relates to a memory apparatus and associated method, and more particularly, to a memory apparatus and associated method capable of recovering/replacing a damaged bit column to increase a yield rate.

BACKGROUND OF THE INVENTION

A chip is a most important hardware component in a modern electronic system. Since functions of the chip have become more and more diversified and complicated, a memory apparatus built in the chip has been adopted to support a memory space for operating the chip. However, a yield rate of the chip is reduced due to damage of the memory apparatus.

SUMMARY OF THE INVENTION

According to the present disclosure, a memory apparatus for recovering damage to increase a yield rate of the memory apparatus and even an overall chip is provided. Memory units for constructing a memory space in the memory apparatus are arranged as a plurality of byte rows and bit columns. In practice, damage frequently occurs in bit columns of the memory apparatus. For example, particle pollution in a semiconductor fabrication may cause damage of a whole bit column thereby promoting failing in accessing data. A simple-structured circuit is provided to replace/recover such type of damage.

One object of the present invention is to provide a memory apparatus comprising a plurality of first bit columns, at least one reserve bit column, a first latching device, a second latching device, a switch circuit and an address matcher. The plurality of first bit columns is stored forming a plurality of byte rows. The first latching device coupled to the plurality of first bit columns latches one selected byte row from the plurality of byte rows. The second bit column stores a plurality of bits. The second latching device coupled to the second bit column latches one of the bits associated with the selected bit row. The switch circuit coupled to the first latching device and the second latching device selectively outputs the selected byte row and the bit associated with the selected byte row.

The switch circuit selects either the first latching device or the second latching device for outputting bits according to a matching result of an access column address and at least one predetermined column address. The address matcher coupled to the switch circuit controls selection of the latching device for outputting bits. The address matcher in sequence regards the column addresses of the plurality of first bit columns as the access column address, and matches each of the access column addresses with each of the at least one predetermined column address, so that the switch circuit can select either the first latching device or the second latching device for outputting bits according to the matching result of each of the access column addresses and each of the at least one predetermined column address. When one access address matches with the at least one predetermined column address, the switch circuit outputs bits via the second latching device; otherwise, the switch circuit outputs bits via the first latching device. In an embodiment, the at least one predetermined column address is stored into a non-volatile memory.

In an embodiment, the memory apparatus further comprises at least one reserve second byte row and a second switch circuit to recover/replace damaged byte rows. As mentioned above, each of the byte rows and each of the second byte rows respectively correspond to a row address. Each of the second byte rows comprises a plurality of third memory units each recording a bit. When one of the byte rows is accessed according to an access row address that matches with a predetermined row address, the second switch circuit controls to access one of the second byte rows. When the access row address does not match with the predetermined row address, the second switch circuit controls to access one of the second byte rows. In an embodiment, the predetermined row address is stored in a non-volatile memory.

According to another object of the present invention, a memory apparatus comprising a plurality of first bit columns, at least one second bit column, a switch circuit, a first latching device, a second latching device, and an address matcher. The plurality of first bit columns comprises at least one damaged column for storing a plurality of byte rows. The at least one second bit column stores at least one correct column data corresponding to the at least one damaged column. When at least one part of the damaged column corresponds to a to-be-read byte row, the switch circuit outputs the at least one part of the correct column data via the at least one second bit column.

The first latching device is for latching the to-be-read byte row. The second latching device is for latching the at least one part of the correct column data of the second bit column. The at least one part of the correct column data corresponds to the to-be-accessed byte row. The switch circuit selectively outputs data via the first latching device or the second latching device. The address matcher coupled to the switch circuit is stored with a damaged column address corresponding to the damaged column, and in sequence matches each of the access column addresses with the damaged column address to generate a matching result. The switch circuit selects either the first latching device or the second latching device according to the matching result.

Yet another object of the present invention is to provide a method applied to a memory apparatus comprising a plurality of first bit columns including at least one damaged column. The method comprises defining a second bit column, stored with a correct column data, corresponding to the damaged column; accessing a byte row; latching a plurality of bit data of the byte row; latching at least one part of the correct column data corresponding to the byte row, with the at least one part of the correct column data being complementary to a part of the plurality of bit data; and outputting the part of the correct column data via the second bit column when the byte row corresponds to the at least one part of the damaged column, i.e., selectively outputting the at least one part of the correct column data or the complementary part of the plurality of bit data.

The first bit columns are first tested to determine a damaged first bit column from the first bit columns, and the damaged first bit column is then regarded as the damaged column corresponding to the second bit column.

In an embodiment, the plurality of first bit columns form a plurality of byte rows, each respectively corresponding to a byte row address. The memory apparatus further comprises at least one second byte row each comprising a plurality of third memory units, each of which records a corresponding data.

The method further comprises accessing one of the at least one second byte row when one of the byte rows is accessed according to an access row address that matches with a predetermined row address; accessing one of the byte rows when the access row address does not match with the predetermined row address.

The byte rows are tested to determine a damaged byte row, and the byte row address corresponding to the damaged byte row is then regarded as the predetermined row address.

According to still another embodiment of the present invention is to provide a method applied to a memory apparatus. The method comprises storing a plurality of byte rows into a main memory; latching one selected byte row of the byte rows; storing a plurality of bits associated with the byte rows into a redundant memory; latching one of the bits; and selectively outputting the selected byte row and the latched bit.

The advantages and spirit related to the present invention can be further understood via the following detailed description and drawings.

DETAILED DESCRIPTION OF THE PREFERRED EMBODIMENT

Figure 1:
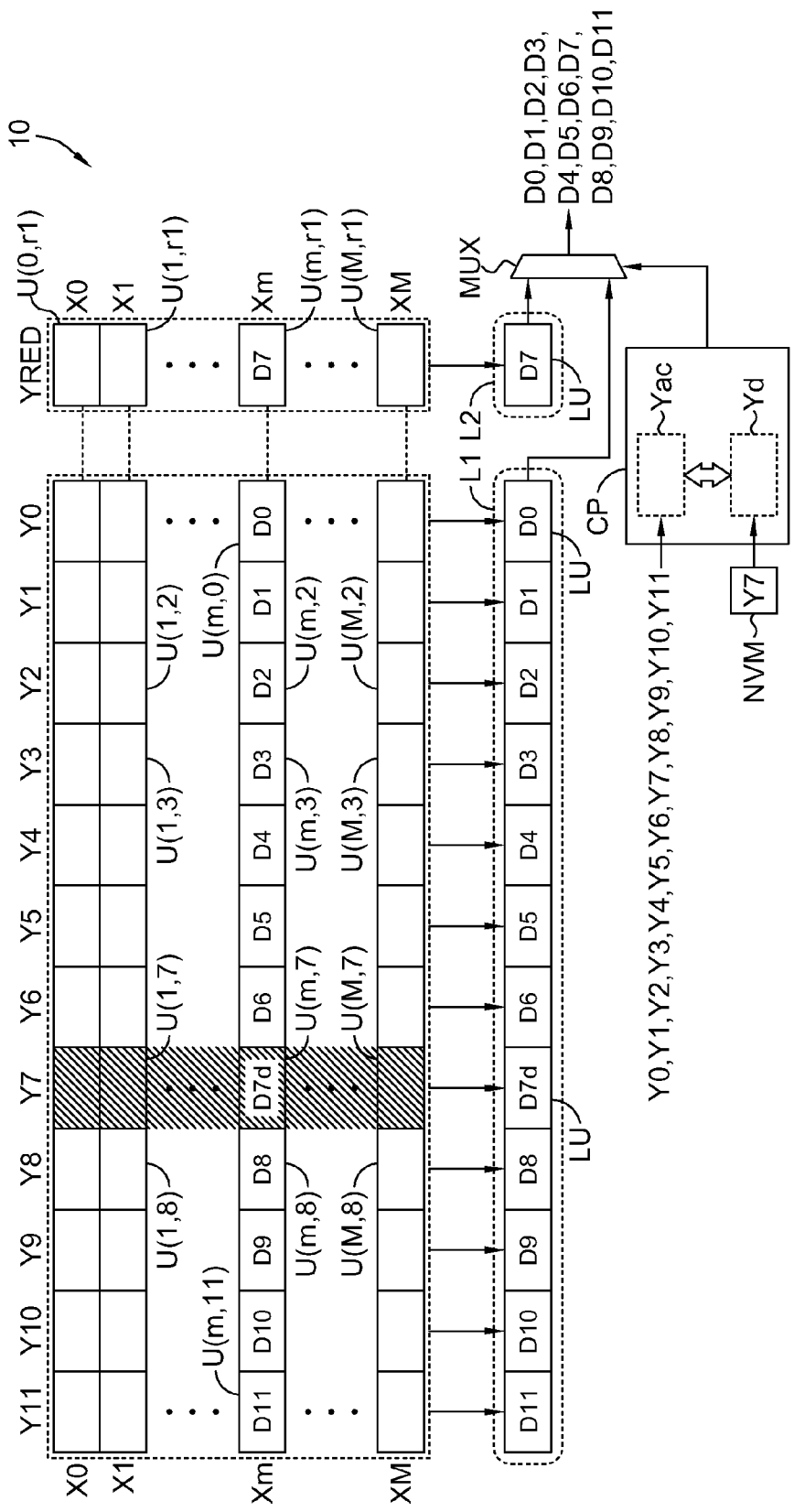
FIG. 1 is a schematic diagram of a memory apparatus in accordance with an embodiment of the present invention.

FIG. 1 is a schematic diagram of a memory apparatus 10 in accordance with an embodiment of the present invention. The memory apparatus 10 is defined in a chip (not shown) comprising a plurality of memory units, which are respectively arranged as a plurality of bit columns and a plurality of bit rows. In FIG. 1, bit columns Y0 to Y11 represent a plurality of bit columns, a plurality of byte rows are represented by byte rows X0, X1 to Xm, and Xm to XM. Each of the bit columns Y0 to Y11 comprises a plurality of memory units, which correspond to a same column address and respectively correspond to one of the byte rows X0 to XM. For example, memory units U(1, 2), U(m, 2) and U(M, 2) correspond to a column address of the bit column Y2, while memory units U(1, 3), U(m, 3) and U(M, 3) correspond to a column address of the bit column Y3. Memory units U(1, 2), U(1, 3), U(1, 7) and U(1, 8) in the bit columns Y2, Y3, Y7 and Y8 correspond to a byte row X1, and memory units U(m, 2), U(m, 3), U(m, 7) and U(m, 8) correspond to an identical byte row Xm. The foregoing memory units respectively record/store one bit of data, and memory units in the form of the byte rows X0 to XM and the bit columns Y0 to Y11 construct a common memory space of the memory apparatus 10, which is regarded as a main memory of the memory apparatus 10. For example, the memory apparatus 10 is defined in a control/driving chip of a display panel for storing an image data. For each scan line of the image data, each of the byte rows X0 to XM is stored with pixel data (e.g., RGB color data) of each corresponding pixel.

When a display panel is controlled to display the image data, each pixel of the same scan line is accessed by referencing a byte row.

However, as mentioned above, pollution and errors in the semiconductor fabrication may damage an entire bit column, e.g., a part of or all of memory units in the bit column are damaged thereby failing in accessing data, such that a yield rate of the chip is also reduced. In order to increase the yield rate, the memory apparatus of the present invention further comprises a reserve bit column that is regarded as an additional spare memory, which is represented by a bit column YRED in FIG. 1. The bit column YRED also comprises a plurality of memory units, e.g., memory units U(0, r1), U(1, r1), U(m, r1) to U(M, r1), each of which is stored with a bit of data. The memory units also correspond to a column address of the bit column YRED, and respectively correspond to byte rows X0, X1, Xm and XM. In other words, each of the byte rows X0 to XM not only corresponds to the plurality of memory units of the bit columns Y0 to Y11, but also corresponds to memory units of the bit column YRED. For example, the memory units U(1, 2), U(1, 3), U(1, 7) and U(1, 8) of the bit columns Y2, Y3, Y7, Y8 and a memory unit U(1, r1) of the bit column YRED correspond to the same byte row X1. Memory units U(m, 0) to U(m, 1) of the bit columns Y0 to Y11 and the memory unit U(m, r1) of the bit column YRED correspond to the same byte row Xm.

In an embodiment of the present invention, each of the memory units is a static random access memory (SRAM) units, e.g., a memory unit formed by six transistors including two transistors acting as a pass-gate transistor and four transistors acting as a feedback inverter, so as to store a one-bit logical piece of data via a bi-stable operation. Memory units in a same byte row are controlled by a same byte line, and gate-pass transistors of the memory units are simultaneously conducted or not conducted controlling information access. The memory units in a same bit column are coupled to a same bit line, and the gate-pass transistors of the memory units control whether to connect the feedback inverters to the bit line.

In order to control access and operations of the bit columns Y0 to Y11 and the bit column YRED, the memory apparatus 10 further comprises two latching devices L1 and L2, a switch circuit MUX (e.g., a multiplexer), a non-volatile memory NVM and an address match unit CP. The switch circuit MUX and the address match unit CP form a recovery mechanism. The switch circuit MUX is coupled to the latching device L1 and the latching device L2. The address match unit CP is coupled to the switch circuit MUX. Corresponding to the bit columns Y0 to Y11, a same number of latching units LU are defined in the latching device L1; with respect to the bit column YRED, a same number of corresponding latching units LU are defined in the latching device L2. When the memory apparatus 10 reads a byte row, memory units of the bit columns Y0 to Y11 corresponding to the byte row store/read data to the corresponding latching units LU of the latching device L1, and the memory unit of the bit column YRED reads the data to the corresponding latching units LU of the latching device L2.

An operating principle of the recovery mechanism of the memory apparatus 10 is described below. The recovery mechanism operates such that, the bit columns Y0 to Y11 are first tested to determine a damaged bit column, and a column address corresponding to the damaged bit column is then recorded as a predetermined column address Yd. At this point, the damaged bit column is a damaged column that corresponds to the predetermined column address Yd. In FIG. 1, supposing that the bit column Y7 is damaged (i.e., the damaged column is Y7), a column address of the bit column Y7 is stored into the non-volatile memory NVM for that it is regarded as the predetermined column address Yd, and the damage bit column Y7 corresponds to the reserve bit column YRED, such that the predetermined column address Yd corresponds to the column address of the reserve bit column YRED for replacing/recovering the damaged bit column Y7.

As stated above, in this embodiment, assume that bit column Y7 is a damaged column. When it is determined that the bit column YRED is going to replace the damaged bit column Y7, the memory apparatus 10 correspondingly accesses the bit column YRED instead of access of the bit column Y7. For example, in the event that bit data D0 to D11 are written into memory units U(m, 0) to U(m, 11) of the bit columns Y0 to Y11 of the byte row Xm, while the memory apparatus 10 writes the data D7 into the memory unit U(m, 7) in the bit column Y7, the data D7 is also written into the memory unit U(m, r1) of the bit column YRED, as shown in FIG. 1. Due to the damage of the bit column Y7, the data written into the memory unit U(m, 7) cannot be accurately recorded (i.e., a data D7d represents an inaccurate/damaged data element in FIG. 1), and the memory U(m, r1) of the bit column YRED, instead of the memory unit U(m, 7), records the data D7 (i.e., the correct column data) correctly. In this embodiment, the data of the memory unit U(m, r1) is complementary to that of the memory unit U(m, 7). In other words, except for error data of the damaged memory unit U(m, 7), data of memory units U(m, 0) to U(m, 11) of the same byte row and the data of the memory unit U(m, r1) construct complete data.

When the data D0 to D11 of bit columns Y0 to Y11 corresponding to the byte row Xm are read and outputted, the data D0 to D11 of the bit columns Y0 to Y11 (together with the inaccurate data D7d) are read and latched in the corresponding latching units LU of the latching device L1; likewise, the data D7 of the bit column YRED recorded in the memory unit U(m, r1) is read and is latched in the latching device L2. When the latched data is outputted, the address matcher CP takes the column addresses of the bit columns Y0 to Y11 in turns as access column address Yac, and compares the access column address Yac with the predetermined column address Yd and generates a matching result (i.e., the column address corresponding to the damaged bit column Y7). The switch circuit MUX selects either the latching device L1 or the latching device L2 for outputting data according to a matching result. When the access column address Yac is a column address of the bit column Y0, the matching result generated by the address matcher CP determines that the access column address Yac does not match with the predetermined column address Yd, as a result, the switch circuit MUX outputs the data D0 via the latching device L1. According to a sequence of the bit columns Y0, Y1, Y2, Y3 to Y11, the address matcher Cp takes the column address of the bit column Y1 as the access column address Yac, and again compares the access column address Yac with the predetermined column address Yd. Since the predetermined column address Yd corresponds to the damaged bit column Y7, it is determined again that the access column address Yac corresponding to the bit column Y1 does not match with the predetermined access address Yd, and the switch circuit MUX continues to outputs the data D1 via the latching device L1. Accordingly, when the address matcher CP compares the column addresses of the bit columns Y0 to Y6 with the predetermined column address Yd, the output data D0 to D6 are in sequence outputted via the latching device L1.

As for taking the column address of the bit column Y7 as the access column address Yac, when the address matcher CP determines that the access column address Yac matches with the predetermined column address Yd, it means that the to-be-read bit column Y7 is the damaged bit column. Therefore, under the control of the address matcher CP, the switch circuit MUX outputs the corresponding data D7 via the latching device L2 instead of the damaged data D7d stored in the bit column Y7. That is, although the damaged data D7d is still read to the latching device L1, under operations of the address matcher CP and the switch circuit MUX, the accurate data D7 read from the reserve memory unit U(m, r1) replaces the damaged data D7d and is outputted thereafter.

In subsequent operations, the address matcher CP takes the column addresses of the bit columns Y8 to Y11 as the access column address Yac, one by one, to compare with the predetermined column address Yd, so that the switch circuit MUX correspondingly outputs the data D8 to D11 of the latching device L1. After that, the memory apparatus 10 can output the accurate data D0 to D11 in sequence according to the column addresses of the bit columns Y0 to Y11 without being undesirably affected by the damaged bit column Y7. In other words, when the bit columns Y0 to Y11 of the common memory space are constructed in the memory apparatus 10, even if an entire bit column is damaged, the memory apparatus 10 still operates normally, such that overall capability of a chip is not influenced by the damaged bit column, thereby increasing a yield rate of the chip.

Figure 2:
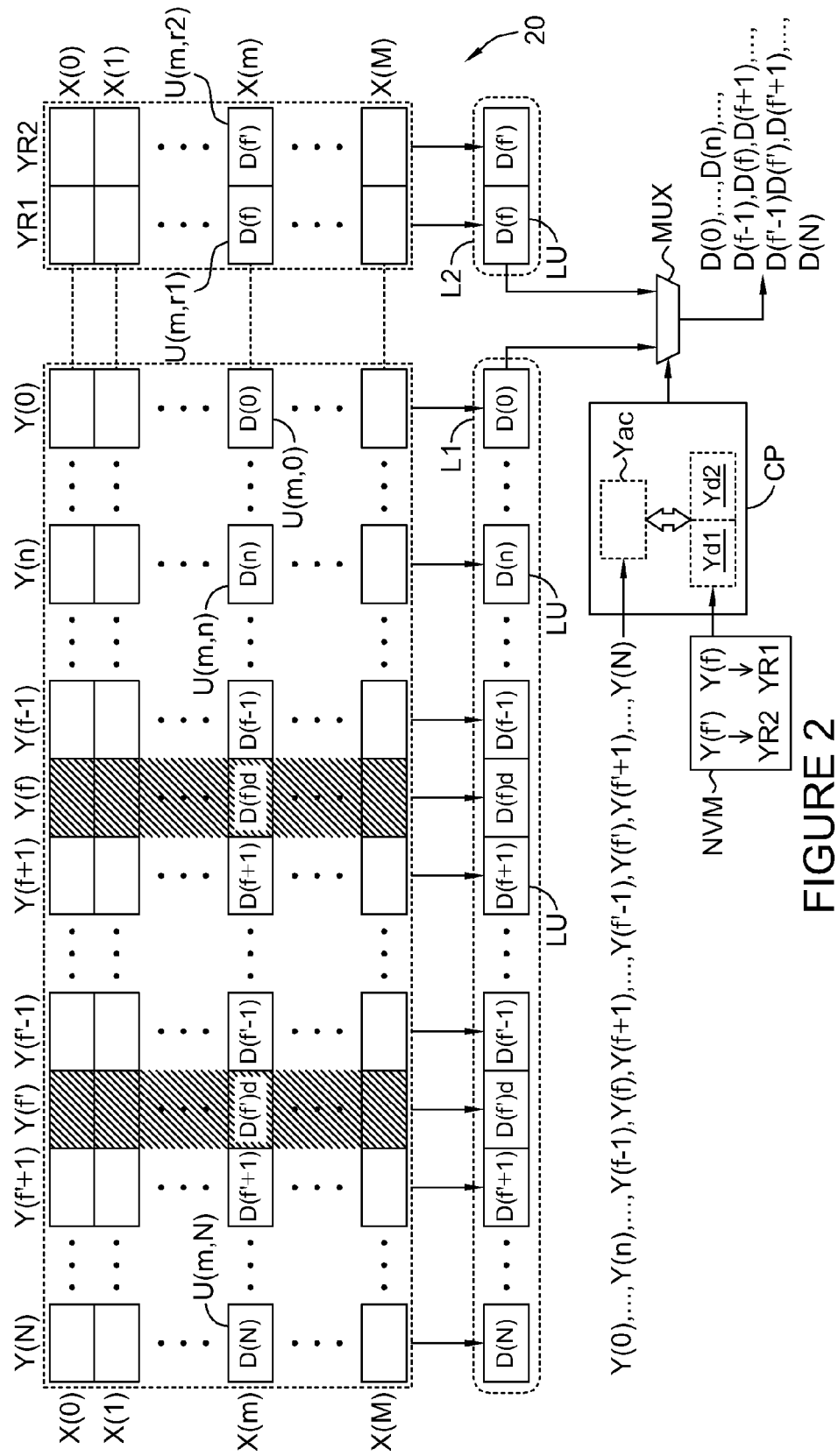
FIG. 2 is a schematic diagram of a memory apparatus in accordance with another embodiment of the present invention.

The technique spirit of the memory apparatus 10 can be expanded to another memory apparatus 20 as shown in FIG. 2. The memory apparatus 20 comprises a plurality of memory units, which are arranged as a plurality of bit columns (e.g., bit columns Y(0), Y(n) and Y(N)) and a plurality of byte rows (e.g., byte rows X(0), X(1), X(m) and X(M)). For example, a memory unit U(m, n) corresponds to the bit column Y(n) and the byte row X(m) for storing one bit of data.

In order to replace/recover damaged bit columns of bit columns Y(0) to Y(N), the memory apparatus 20 comprises a plurality of reserve bit columns serving as spare memories, which are represented by two bit columns YR1 and YR2. A plurality of memory units corresponding to byte rows X(0) to X(M) are defined in the bit columns YR1 and YR2. For example, a memory unit U(m, r1) of the bit column YR1 corresponds to the bit column YR1 and the byte row X(m), and a memory unit U(m, r2) of the bit column YR2 corresponds to the bit column YR2 and the byte row X(m).

Similar to the memory apparatus 10 in FIG. 1, with respect to the bit columns Y(0) to Y(N) and the byte rows YR1 and YR2, the memory apparatus 20 in FIG. 2 also comprises two latching devices L1 and L2, a switch circuit MUX, a non-volatile memory NVM and an address matcher CP. Corresponding to the bit columns Y(0) to Y(N), a same number of latching units LU corresponding to the bit columns Y(0) to Y(N) are defined in the latching device L1, and a same number of latching units LU corresponding to the number of reserve bit columns YR1 and YR2 are defined in the latching device L2. The switch circuit MUX, the address matcher CP and the latching devices L1 and L2 are combined to a data rearranging module.

A recovery mechanism of the memory apparatus 20 is described below. The recovery mechanism is that, the bit columns Y(0) to Y(N) are first tested to record column addresses corresponding to damaged bit columns as predetermined column addresses Yd. Since the memory apparatus comprises a plurality of reserve bit columns, the damaged bit columns are replaced/recovered by the bit columns Y(0) to Y(N). In FIG. 2, supposing that bit columns Y(f) and Y(f') are damaged (i.e., there are two damaged columns), the two damaged bit columns Y(f) and Y(f') are respectively replaced by the ready bit columns YR1 and YR2, and such replacing/ recovering behaviors are stored in the non-volatile memory NVM. Column addresses of the bit columns Y(f) and Y(f') are respectively recorded as predetermined column addresses Yd1 and Yd2.

When the damaged bit columns Y(f) and Y(f') are respectively replaced by the bit columns YR1 and YR2, the memory 20 correspondingly accesses the bit columns YR1 and YR2 according to the accessing the bit columns Y(f) and Y(f'). For example, when data D(0) to D(N) are written into memory units of bit columns Y(0) to Y(N) corresponding to the byte row X(m), the memory apparatus 20 respectively writes data D(f) and D(f') into memory units of the damaged bit columns Y(f) and Y(f'), and also respectively writes the data D(f) and D(f') into the corresponding memory units U(m, r1) and U(m, r2) of the reserve bit columns YR1 and YR2, so as to replace inaccurately-recorded data D(f)d and D(f')d of the bit columns Y(f) and Y(f').

When the data D(0) to D(N) of the bit columns Y(0) to Y(N) corresponding to the byte row X(m) are read and outputted, the data D(0) to D(N) of the bit columns Y(0) to Y(N) (together with the inaccurate data D(f)d and D(f')d) are read and latched in the latching units LU of the latching device L1. Likewise, the data D(f) and D(f') of the bit columns YR1 and YR2, recorded in the memory units U(m, r1) and U(m, r2), are read to the latching units of the latching device L2. When the latched access data are outputted, the address matcher CP compares, one by one, the bit addresses of the bit columns Y(0) to Y(N) as an access column address Yac, and respectively matches the access column address Yac with the predetermined column address Yd1/Yd2 to determine whether the access column address Yac matches with either the predetermined column address Yd1 or Yd2. The switch circuit MUX selects to output data via either the latching device L1 or the L2 according to a matching result.

When the address matcher CP takes in sequence the bit addresses of the bit columns Y(0) to Y(f-1) as the access column address Yac, once it is determined that the access column address Yac does not match with any of the predetermined column address Yd1 and Yd2, then the switch circuit MUX outputs the data D(0) to D(f-1) via the latching device L1. The address matcher CP continues to perform matching, comparing the column address of the bit column Y(f) with the access column address Yac. Since the access column address Yac matches with the predetermined column address Yd1, the switch circuit MUX outputs the data D(f) from the latching device L2 rather than the erroneous data D(f)d in the latching device L1.

The address matcher CP then compares, in sequence, the column addresses of the bit columns Y(f+1) to Y(f'-1) with the two predetermined column addresses Yd1 and Yd2, and the switch circuit MUX outputs, in sequence, corresponding data D(f+1) to D(f'-1) in the latching device L1. However, when the address matcher CP regards the column address of the bit column Y(f') as the access column address Yac, which matches with the predetermined column address Yd2, the switch circuit MUX changes to output the corresponding data D(f') from the latching device L2.

The address matcher CP continues, in sequence, to compare the column addresses of the bit columns Y(f'+1) to Y(N) as the access column address Yac which do not match with the predetermined column address Yd1 or Yd2, and so, the switch circuit MUX correspondingly outputs remaining data D(f'+1) to D(N) in the latching device L1. After that, the memory apparatus 20 in sequence outputs accurate data D(0) to D(N) according to a column address sequence of the bit columns Y(0) to Y(N) without being affected by the damaged portion of the bit columns Y(f) and Y(f').

Figure 3:
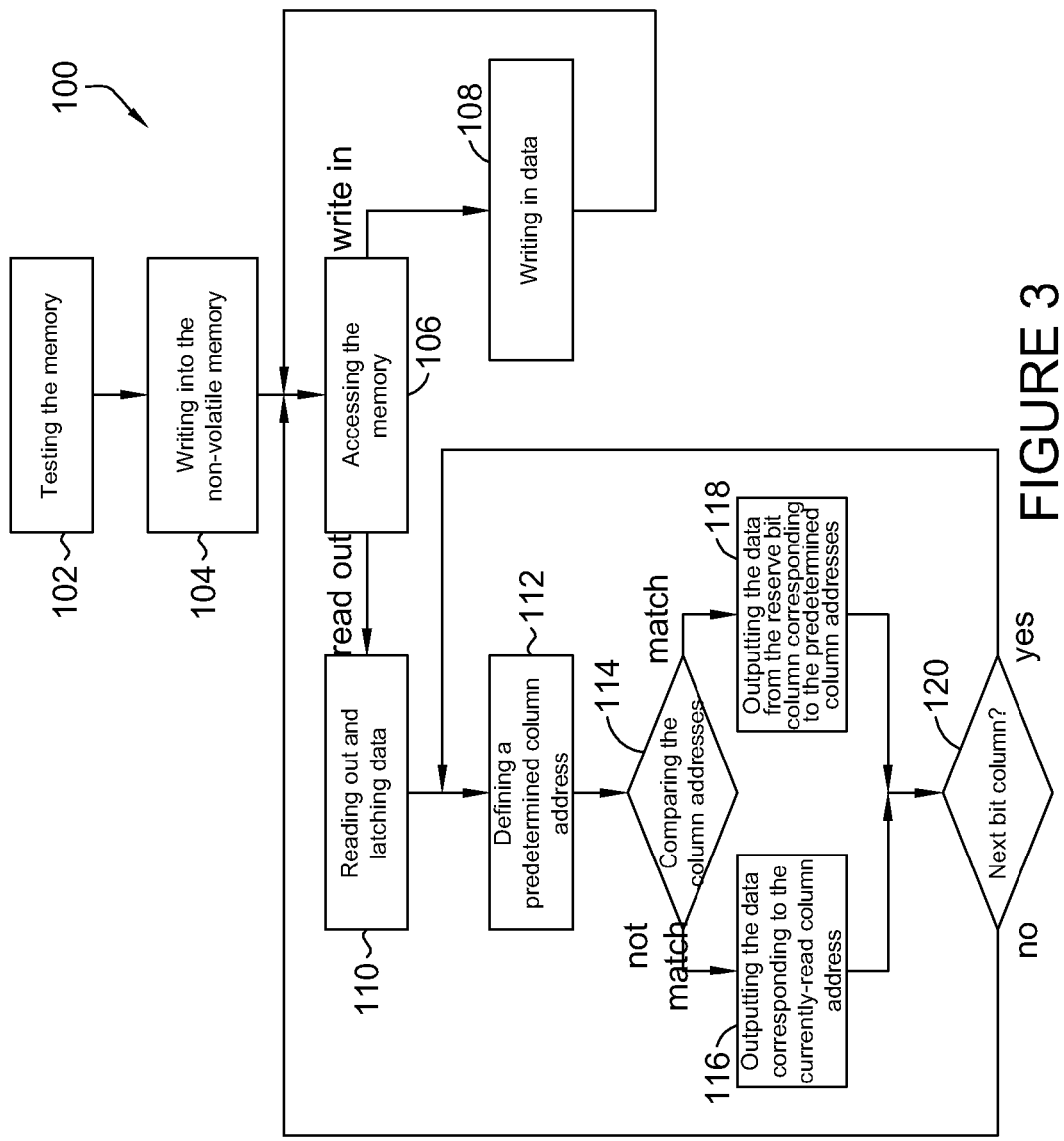
FIG. 3 is a flow chart of an operating method for the memory apparatuses in FIG. 1 and FIG. 2 in accordance with an embodiment of the present invention.

FIG. 3 shows a flow chart of an operating flow 100 for recovering/replacing a damaged bit of the memory apparatuses 10 and 20 in FIG. 1 and FIG. 2. Main steps of the flow 100 are described below.

In Step 102, a memory apparatus of a chip is tested before leaving factory to test whether there are damaged bit columns, and column addresses of the damaged bit columns are identified and reserved bit columns are utilized for replacing the damaged bit columns when damaged bit columns exist in the chip. As shown in FIG. 2, bit columns Y(f) and Y(f') are tested as damaged bit columns, therefore they are respectively replaced/recovered by reserve bit columns YR1 and YR2. In Step 104, information obtained in Step 102 is recorded/written/burned into a non-volatile memory NVM (as shown in FIG. 1 and FIG. 2) to set the column addresses of the damaged bit columns as the predetermined column addresses. That is, the column addresses of the damaged bit columns Y(f) and Y(f') are recorded as the predetermined column addresses Yd1 and Yd2 as disclosed in the description of the memory apparatus 20. Step 102 and Step 104, when performed before the chip leaves factory, are regarded as predetermined operations of the operating method according the present disclosure. After the chip leaves factory, Step 106 is performed every time the chip begins operating and accessing the memory apparatus. In Step 106, the damaged bit columns are recovered/replaced according to the information recorded in the non-volatile memory NVM during access. When data is written into the memory apparatus, Step 108 is performed; when the memory apparatus is read, Step 110 is performed. In Step 108, data bits are written into corresponding memory units one by one. That is, when data is written into a memory unit of a damaged bit column, it is also written into a corresponding memory unit of the reserve bit column. Referring to FIG. 2 as an example, the data D(0) to D(N) are respectively written into the memory units U(m, 0) to U(m, N). In addition, when the data D(f)/D(f') is written into the memory unit U(m, f)/U(m, f') of the damaged bit columns Y(f)/Y(f'), it is also written into the corresponding memory unit U(m, r1)/U(m, r2) of the reserve bit column YR1/YR2. In Step 110, when a byte row is to be read, the memory apparatus reads a plurality of data (i.e., bytes) from memory units corresponding to the byte row, and writes the plurality of data into the corresponding latching device L1. In addition, the data stored in the memory units of the reserve bit columns in Step 108 are also written into the corresponding latching device L2. As shown in FIG. 2, when data of a byte row X(m) of the memory apparatus are read and outputted in Step 110, the data D(0) to D(N) stored in the memory units U(m, 0) to U(m, N) are read and latched to the latching device L1. The data D(f) and D(f') stored in the memory units U(m, r1) and U(m, r2) of the bit columns YR1 and YR2 are provided to the latching device L2. In Step 112, predetermined column addresses are defined for matching. Column addresses of damaged bit columns are used as the predetermined column addresses. In addition, the address matcher CP also defines an access column address Yac. For example, at the beginning of Step 112, the access column address Yac is defined as the column address corresponding to the bit column Y(0). When Step 112 is iterated, i.e., when a column address of a bit column Y(n) is regarded as the access column address Yac in the previous Step 112, a column address of a bit column Y(n+1) is regarded as the access column address Yac in the current Step 112. In Step 114, the predetermined column addresses and the column address of the current access bit column are compared to determine whether the currently-read column address is the column addresses of the damaged bit columns. When the currently-read column address matches with the predetermined column addresses, Step 118 is performed; otherwise Step 116 is performed. Referring to the memory apparatus 20 in FIG. 2 as an example, the address matcher CP compares the access column address Yac with the recorded predetermined column address Yd1/Yd2 (i.e., the column addresses of the damaged bit columns). When the access column address Yc matches with the predetermined column address Yd1 or Yd2, Step 118 is performed; otherwise, when the access column address Yac does not match with any of the predetermined column addresses Yd1 and Yd2, Step 116 is performed. When the matching result of Step 114 is negative, the flow proceeds to Step 116 in which the data is outputted via the latching device L1 corresponding to the currently-read column address. For example, the switch circuit MUX in FIG. 2 outputs the data corresponding to the access column address Yac via the latching device L1. More specifically, when the access column address Yac corresponds to the column address of the bit column Y(n), the switch circuit MUX outputs the data D(n) of the latching device L1. When the matching result of Step 114 is positive, the flow proceeds to Step 118 in which data is outputted via the latching device L2 corresponding to the predetermined column addresses. Referring to FIG. 2 as an example, the switch circuit MUX outputs data from the latching device L2. For example, when the access column address Yac corresponds to the damaged bit column Y(f), the switch circuit MUX outputs the data D(f) of the latching device L2. After Step 116 or Step 118, the flow proceeds to Step 120 to determine whether any bit column has not yet been accessed in the accessed byte row. When a determination result of Step 120 is positive, Step 112, Step 114, Step 116 and Step 118 are repeated. For example, when there are other to-be-outputted data corresponding to other bit columns of the byte row X(m), the flow returns to Step 112; when all bit columns Y(o) to Y(N) corresponding to the byte row X(m) have been outputted, the flow returns to Step 106.

Figure 4:
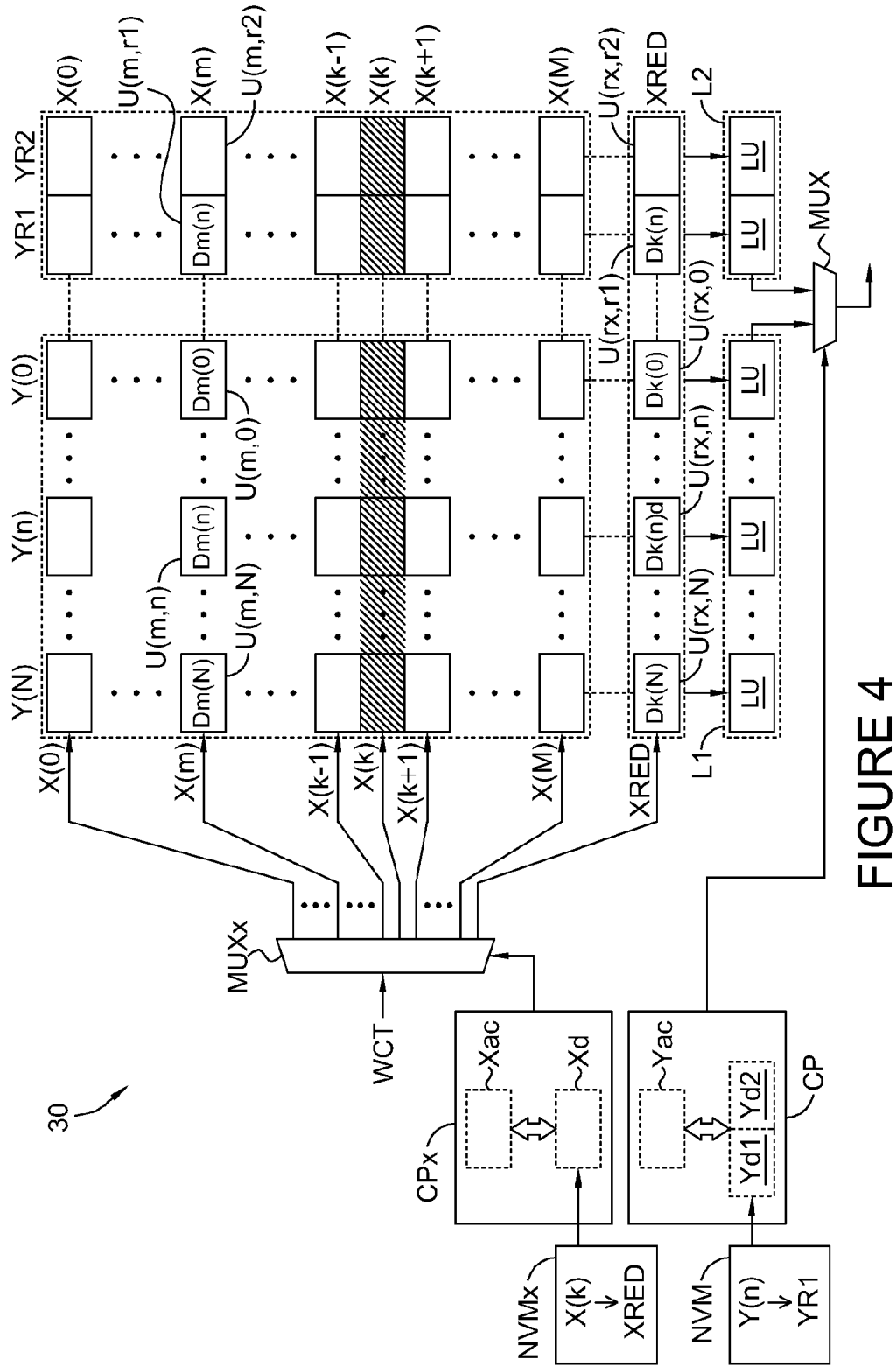
FIG. 4 is a schematic diagram of a memory apparatus in accordance with yet another embodiment of the present invention.

FIG. 4 shows a schematic diagram of a memory apparatus 30 in accordance with an embodiment of the present invention. The memory apparatus 30 is defined in a chip, of which a plurality of memory units (e.g., memory units U(m, 0) to U(m, N)) of byte rows X(0) to X(M) and bit columns Y(0) to Y(N) construct a common memory space of the memory apparatus 30. Similar to the memory apparatus 20 in FIG. 2, the memory apparatus 20 in FIG. 4 also comprises reserve bit columns (representing by by bit columns YR1 and YR2), latching devices L1 and L2, a switch circuit MUX, an address matcher CP and a non-volatile memory NVM, so as to recover/replace damaged bit columns.

The memory apparatus 30 further comprises a reserve byte row (representing by a byte row XRED), associated with an address matcher CPx, a switch circuit MUXx, and a non-volatile memory NVMx to recover/replace a damaged bit byte row. The reserve byte row comprises a plurality of memory units U(rx, 0) to U(rx, N) corresponding to the bit columns Y(0) to Y(N), and memory units U(rx, r1) and U(rx, r2) respectively corresponding to bit columns YR1 and YR2. Operations of the memory apparatus 20 that recovers/replaces the damaged byte rows are described below. Before a chip/the memory 30 leaves factory, byte rows are first tested to determine the damaged byte row. In FIG. 4, suppose that a byte row X(k) is the damaged byte row and is recover/replaced by the reserve byte row XRED. The foregoing corresponding relationships are recorded in the non-volatile memory NVMx.

After the chip leaves factory and begins operating and accessing (reading or writing) a corresponding byte row of the memory apparatus 30 according to an access row address Xac, the address matcher CPx defines the damaged byte row X(k) as the predetermined row address Xd according to records of the non-volatile memory NVMx, and compares the accessed row address Xac with the predetermined row address Xd. When the accessed row address Xac does not match with the predetermined row address Xd, it means that a to-be-read byte row is not the damaged byte row, so that the switch circuit MUXx transmits a byte row control signal WCT to the byte row corresponding to the accessed row address Xac so as to read the byte row. For example, when the accessed row address Xac corresponds to a row address of the byte row X(m) that is not damaged, the byte row control signal WCT controls to read memory units U(m, 0) to U(m, N) and even memory units U(m, r1) and U(m, r2) of the byte row X(m). More specifically, the byte row control signal WCT transmitted to the byte row X(m) controls to conduct gate-pass transistors between the memory units U(m, j) to U(m, N), and a gate-pass transistor between the memory units U(m, r1) and U(m, r2), so that data Dm(0) to Dm(N) are written into the memory units (m, 0) to U(m, N). Alternatively, data stored in the memory units U(m, 0) to U(m, N) and memory units U(m, r1) and U(m, r2) are read to corresponding latching units LU in the latching devices L1 and L2.

When the access row address Xac matches with the predetermined row address Xd, it means that the to-be-read-byte row is the damaged byte row X(k). At this point, the address matcher CPx controls the switch circuit MUXx to transmit the byte row control signal WCT to the reserve byte row XRED corresponding to the byte row X(k) so as to read the byte row XRED. That is, the data originally written into the byte row X(k) is finally written into the byte row XRED, and the data original read from the byte row X(k) is finally read from the byte row XRED.

In the memory apparatus 30, recovery/replacement of the damaged byte row is performed together with recovery/replacement of a damaged bit column. For example, suppose that the byte row X(k) and the bit column Y(n) are damaged and are respectively recovered/replaced by the reserve byte row XRED and the reserve bit column YR1. When data Dk(0) to Dk(N) are written into bit columns Y(0) to Y(N) of the byte row X(k), the address matcher CPx and the switch circuit MUXx write the data into memory units U(rx, 0) to U(rx, N) of the byte row XRED. Under the recovery/replacement mechanism of the bit columns, the data Dk(n) written into the memory unit U(rx, n) is also written into the memory unit U(rx, r1). Since the bit column Y(n) is damaged, the data Dk(n) cannot be accurately stored into the memory unit U(rx, n) of the bit column Y(n) corresponding to the byte row XRED (a data Dk(n)d represents the inaccurately-stored data Dk(n) in FIG. 4), and the accurate data Dk(n) is still stored in the memory unit U(rx, r1) of the reserve bit column YR1. When the data of the byte row X(k) are accessed and outputted, the adder matcher CPx and the switch circuit MUXx read and latch the data Y(0) to Y(N) of the byte row XRED to the latching device L1, and read and latch the data of the bit columns YR1 and YR2 of the byte row XRED to the latching device L2. The address matcher CP and the switch circuit MUX replaces the inaccurate data DK(n)d of the damaged bit column Y(n) by the data Dk(n) of the bit column YR1 for outputting data.

The non-volatile memories NVM (and NVMx) illustrated in FIGS. 1, 2 (and 4) are realized by read-only memories (ROMs), one-time programming (OTP) memories and/or electrical-fuse (E-fuse) memories. Alternatively, the non-volatile memories NVM and NVMx are different blocks of a non-volatile memory. The address matcher CP/CPx is realized by hardware or firmware. The address matcher CPx may be integrated with a row address decoder. A memory apparatus provided by the present invention is widely applied to various types of chips, e.g., a chip of a handheld wireless communication electronic apparatus.

In conclusion, compared to the prior art, a memory apparatus according to the present disclosure is capable of recovering/replacing an overall bit column or byte row without undesirably affecting normal operations of a chip, so as to increase a yield rate of the chip.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A memory apparatus, comprising:
   a plurality of first bit columns, for defining a plurality of byte rows, comprises a plurality of first memory units, each first memory unit records a bit, each first memory unit in the same first bit column corresponds to a first column address, and each first memory unit is also respectively associated with one of the plurality of byte rows;
   a first latching device, coupled to the first bit columns, for latching a selected byte row of the plurality of byte rows;
   at least one second bit column, for storing a plurality of bits, comprising a plurality of second memory units, each second memory unit records a bit, each second memory unit in the second bit column corresponds to a second column address, and each second memory unit is also respectively associated with one of the plurality of byte rows;
   a second latching device, coupled to the at least one second bit column, for latching one of the bits associated with the selected byte row; and
   a switch circuit, coupled to the first latching device and the second latching device, for selectively outputting the selected byte row and the bit associated with the selected byte row;
   wherein the switch circuit selects one of the first latching device and the second latching device, and outputs an output bit according to a comparison result of an access column address and at least one predetermined column address.

2. The memory apparatus as claimed in claim 1, further comprising:
   an address match unit, coupled to the switch circuit, for controlling a selection of the output bit of the switch circuit, wherein the address match unit takes the column addresses of the first bit columns as an access column address and compares each access column address in sequence with the at least one predetermined column address to generate a comparison result indicating selection of the output bit from the first latching area or the second latching area.

3. The memory apparatus as claimed in claim 2, wherein when the access column address matches with one of the at least one predetermined column address, the switch circuit outputs the output bit from the second latching device; otherwise, the switch circuit outputs the output bit from the first latching device.

4. The memory apparatus as claimed in claim 1, further comprising:
   a non-volatile memory, for storing the at least one predetermined column address.

5. The memory apparatus as claimed in claim 1, wherein each of the byte rows respectively correspond to a byte row address, and the memory apparatus further comprises:
   at least one second byte row, comprising a plurality of third memory units, each third memory unit recording a bit; and
   a second switch circuit, for controlling access to one of the at least one second byte row when an access row address matches with a predetermined row address, and controlling access to one of the byte rows when the access row address does not match the predetermined row address.

6. The memory apparatus as claimed in claim 5, further comprising:
   a non-volatile memory, for storing the predetermined row address.

7. A memory apparatus, comprising:
   a plurality of first bit columns, comprising at least one damaged column, defining a plurality of byte rows;
   a second bit column, for storing a undamaged column data corresponding to the at least one damaged column;
   a switch circuit, for selecting the second bit column for outputting at least part of the undamaged column data if a to-be-accessed byte row corresponds to the at least part of the undamaged column data, wherein the to-be-accessed byte row comprises a plurality of to-be-accessed bits corresponding to a plurality of access column addresses;
   a first latching device, for latching the to-be-accessed byte row;
   a second latching device, for latching the at least part of the undamaged column data corresponding to the to be byte row; and
   an address matcher unit, coupled to the switch circuit, storing a damaged column address corresponding to the at least one damaged column, wherein the address matcher unit compares the plurality of access column addresses, in sequence, with the damaged column address to generate a matching for controlling the switch circuit to perform selection of output data accordingly;
   wherein, the switch circuit selectively outputs data from either the first latching device or the second latching device.

* * * * *